United States Patent [19]

Milberger et al.

[11] Patent Number: 4,743,785
[45] Date of Patent: May 10, 1988

[54] FET PULSE CONTROL APPARATUS WITH FAST RISE TIME AND CONSTANT PULSE LEVEL

[75] Inventors: Walter E. Milberger, Severna Park; Charles S. Kerfoot, Pasadena, both of Md.

[73] Assignee: Westinghouse Electric Corp., Pittsburgh, Pa.

[21] Appl. No.: 21,852

[22] Filed: Mar. 4, 1987

[51] Int. Cl.[4] .................... H03K 17/687; H03K 3/017
[52] U.S. Cl. .................................... 307/571; 307/584; 307/270; 307/266; 307/549
[58] Field of Search ................ 307/571, 266, 544–549, 307/584, 270, 570, 601

[56] References Cited

U.S. PATENT DOCUMENTS

| | | | |
|---|---|---|---|
| 4,425,518 | 1/1984 | Milberger | 307/571 |
| 4,454,430 | 6/1984 | Miller | 307/571 |
| 4,527,077 | 7/1985 | Higuchi et al. | 307/551 |
| 4,565,931 | 1/1986 | Fumey | 307/571 |

Primary Examiner—Stanley D. Miller
Assistant Examiner—B. P. Davis
Attorney, Agent, or Firm—W. G. Sutcliff

[57] ABSTRACT

A high-voltage FET pulser for a synthetic aperture radar transmitter includes an FET ON switch and a tail biter switch both on the floating deck and coupled to a pulse driver circuit through a transformer having a quartz glass tube isolating the secondary winding from the core and primary winding. An active shunt regulator circuit is connected to the output of the FET ON switch to provide a flat output pulse free of ringing.

10 Claims, 3 Drawing Sheets

FET PULSE CONTROL APPARATUS WITH FAST RISE TIME AND CONSTANT PULSE LEVEL

STATEMENT OF GOVERNMENT INTEREST

This invention was made with Government support under Contract No. DAAK 20-83-C-0889 awarded by the Department of the Army. The Government has certain rights in this invention.

BACKGROUND OF THE INVENTION

The invention relates to high voltage switching apparatus and, more particularly, to high voltage switching apparatus using a field effect transistor pulse control circuit for a synthetic aperture radar transmitter.

It is known in the art to provide high voltage pulse apparatus using field effect transistors (FETs). For example, U.S. Pat. No. 4,425,518 discloses high speed FET transistor pulse apparatus with a quick rise time. Such apparatus provides excellent performance in applications such as pulse doppler radar transmitters.

The apparatus disclosed in U.S. Pat. No. 4,425,518 exhibits disadvantages when used in certain other applications. For example, a certain amount of ringing during the pulse duration between the rising and falling edges of the pulse is acceptable in pulse doppler applications but can greatly limit performance in synthetic aperture radar applications. It is therefore an object of the invention to provide apparatus exhibiting extremely flat output pulses with a minimum of ringing.

In addition, for certain applications involving extremely fast rise time pulses, unsatisfactory results were sometimes obtained. It has subsequently been discovered that some of these effects are due to the phenomenon of Miller integration in which the internal capacitance between the drain and gate of field effect transistors (FETs) forms a negative feedback circuit which limits the rise and fall times of signals applied to such devices. It is therefore an object of the invention to provide a high voltage pulse apparatus which does not exhibit performance limitations caused by Miller integration.

Certain types of high-power transmitting tubes, such as travelling wave tubes, exhibit considerable variation in their grid requirements for a B+ power supply. In prior art arrangements, such variation was accommodated by providing an adjustable B+ supply or by substituting entirely different B+ supplies if it was determined through testing that such supplies were required. It would therefore be desirable to provide pulse apparatus for use with tubes exhibiting such variation in B+ supply requirements which did not require separate or adjustable B+ supplies.

In radar applications employing high voltage pulse apparatus, a first portion of the circuit is conventionally constructed using a low voltage reference potential and a second portion of the circuitry constructed using a high voltage reference potential. The first circuit portion is commonly referred to as the "ground deck" and the second portion is commonly referred to as the "floating deck." It is necessary to transmit control information from the ground deck to the floating deck. One method employed in the prior art was to transmit a control pulse consisting of a replica of the desired high voltage output pulse from the ground deck to the floating deck using video transformers. Such apparatus had the disadvantage of coupling undesired noise between the ground deck and the floating deck. Other prior art apparatus transmitted separate ON and OFF pulses from the ground deck to the floating deck and then constructed the output pulse entirely on the floating deck. The control pulses were sometimes transmitted between the ground deck and the floating deck using toroid transformers with wound or potted dielectric material. The former design provided difficulties in fabrication, whereas the latter often exhibited problems when subjected to extreme environmental conditions. Another method of transmitting the control pulses between the ground deck and floating deck in the prior art employed optoisolator circuits. While such circuits prove useful in certain applications, the variable delays exhibited between multiple optical isolators cause difficulties in other applications. It is therefore an object of the invention to provide high voltage switching apparatus in which control information is transmitted between the ground deck and floating deck while avoiding the above-discussed difficulties.

SUMMARY OF THE INVENTION

In order to achieve these and other objects, the invention in one aspect provides a high-voltage pulse apparatus comprising means referenced to a low potential reference level for receiving control pulses; first switch means referenced to high potential reference level, the first switch means having an output terminal and being responsive to the control pulses for generating a fast rise time output pulse at that output terminal; second switch means referenced to the high potential level and coupled to the first switch means for terminating the output pulse; and means for coupling the control pulse receiving means to the first and second switch means. The invention may further comprise clamp means coupled to the output terminal for maintaining a constant voltage of the output pulse during the duration of the output pulse. The coupling means may comprise a transformer including a primary winding referenced to the low potential reference level, a secondary winding referenced to the high potential reference level, and insulation means formed of quartz glass for electrically isolating the primary and secondary windings.

The apparatus may further comprise first and second pluralities of FETs, the first plurality of FETs connected between a first voltage supply of a first polarity referenced to the high potential referenced level and an output terminal. The second plurality of FETs is connected between the output terminal and a second voltage supply of opposite polarity referenced to the high potential reference level, with a first diode connected between the output terminal and the second plurality of FETs, a second diode connected between the output terminal and the first voltage supply, and a third diode connected between the first switch means output terminal and the second voltage supply.

DESCRIPTION OF THE PREFERRED EMBODIMENT

Figure 1:
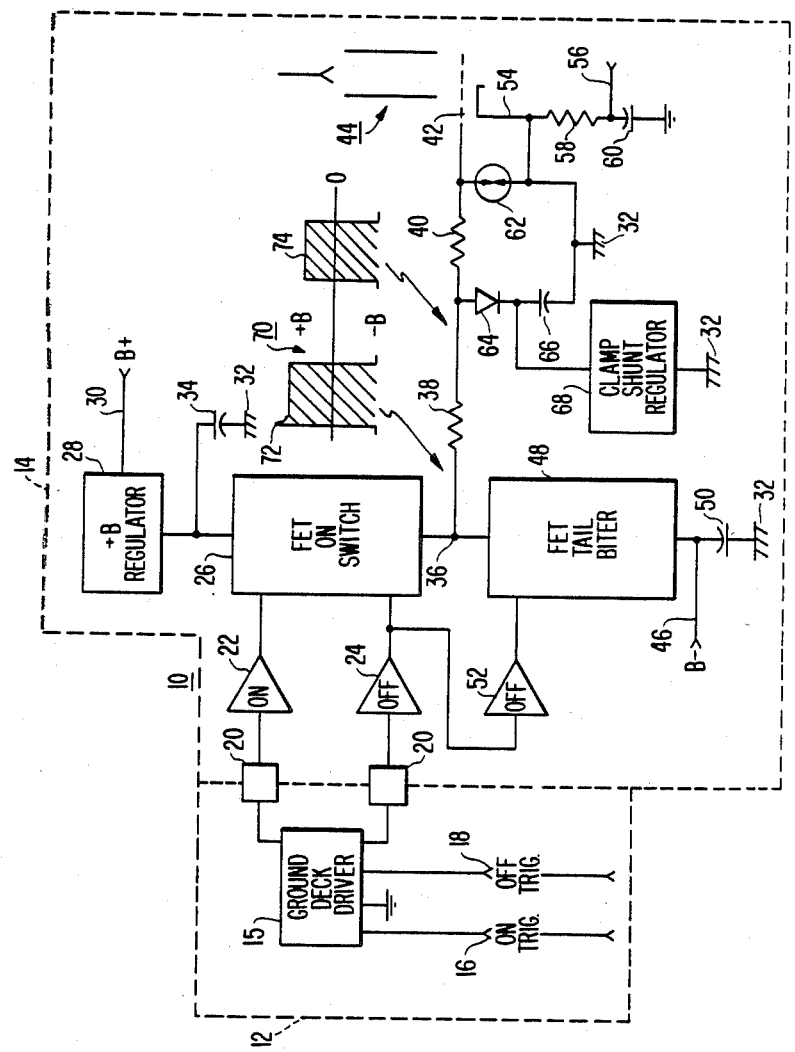
FIG. 1 is a block diagram of high voltage switching apparatus constituting a preferred embodiment of the present invention and incorporating the principles thereof.

Referring now to the drawings, in which like reference characters refer to corresponding elements, FIG. 1 shows a block diagram of high voltage switching apparatus 10 constituting a preferred embodiment of the present invention. The apparatus 10 includes portions within dashed lines indicated at 12 and 14 which are respectively referenced to a low potential reference level of ground, or zero potential, and a high potential reference level of forty kilovolts. The first portion 12 is often referred to in the art as the ground deck, and second portion 14 is often referred to as the floating deck. The invention includes means referenced to a low potential reference level for receiving control pulses. As embodied herein, such control pulse receiving means comprises a ground deck driver circuit 15 having terminals 16 and 18 for receiving control pulses consisting of an ON trigger and an OFF trigger.

Ground deck 12 transmits the ON and OFF trigger signals through coupling transformers 20 to ON and OFF pulse drivers 22 and 24 respectively. The invention further includes first switch means referenced to a high potential reference level, the first switch means having an output terminal and being responsive to the control pulses for generating a fast rise time output pulse at the output terminal. As embodied herein, the first switch means comprises an FET ON switch 26. Drivers 22 and 24 supply ON and OFF pulse control signals to FET on ON signal 26.

FET ON switch 26 is supplied with a regulated B+ supply voltage by a B+ regulator circuit 28 which is in turn connected to a source of unregulated B+ supply voltage at terminal 30 at a voltage of, for example, 650 volts. The output of B+ regulator circuit 28 is bypassed to a high potential reference level 32 through a bypass capacitor 34. High potential reference level 32 will hereinafter be referred to as floating deck ground.

FET ON switch 26 includes an output terminal 36 which is coupled through a clamp resistor 38 and a grid input current limiting resistor 40 to the control grid 42 of a travelling wave tube 44.

Figure 2:
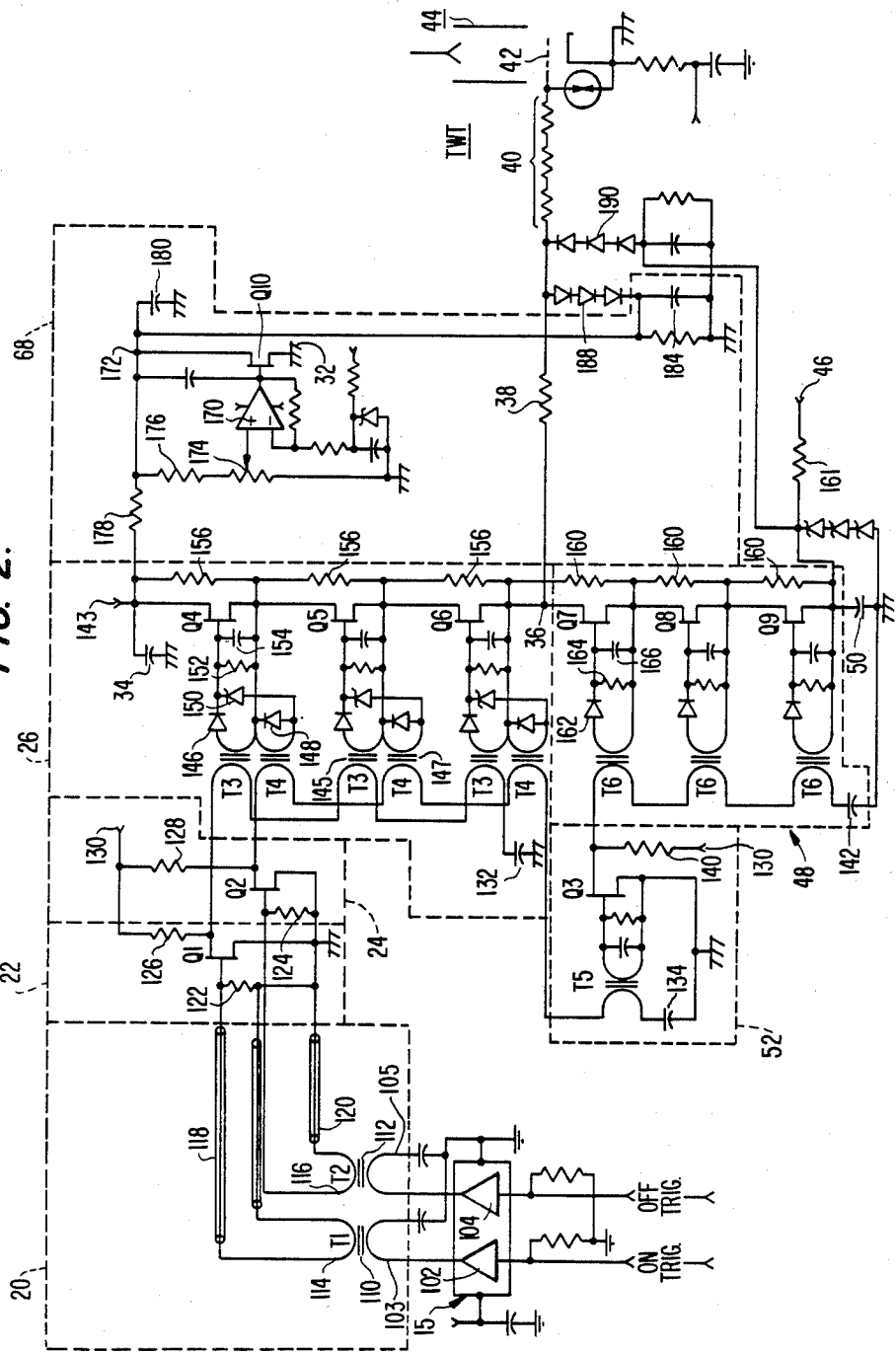
FIG. 2 is a detailed electrical schematic diagram of the apparatus shown in FIG. 1.

The invention further comprises second switch means referenced to the high potential reference level and coupled to the first switch means for terminating the output pulse. As embodied herein, the second switch means comprises a pulse cut-off circuit 48. Output terminal 36 is connected to a source of B— voltage through pulse cutoff circuit 48 and terminal 46. B— terminal 46 is also coupled to floating deck ground 32 via a coupling capacitor 50. An OFF control pulse produced by OFF control pulse driver 24 is supplied through a pulse cutoff driver 52 to the input of pulse cutoff circuit 48. The invention further includes means for coupling the control pulse receiving means to the first and second switch means. As embodied herein, the coupling means includes transformers T1 and T2 (FIG. 2).

Travelling wave tube 44 includes a cathode 54 which is connected to a source 56 of negative high potential through a cathode current limiting resistor 58. Negative high voltage potential terminal 56 is bypassed to zero potential through a bypass capacitor 60. An arc suppression spark gap device 62 is connected between grid 42 and cathode 54 of travelling wave tube 44 to limit the voltage applied to circuits 26 and 48 across grid 42 and cathode 54 to a prescribed level by shunting current to floating deck ground 32.

The series combination of a diode 64 and capacitor 66 are connected between floating deck ground 32 and the junction of clamp resistor 38 and grid input current limiting resistor 40. A clamp shunt regulator circuit 68 is connected between the junction of diode 64 and capacitor 66, and floating deck ground 32.

Briefly, the operation of apparatus 10 is as follows. ON and OFF trigger pulses are supplied to terminals 16 and 18 of ground deck 14 to define the ON and OFF times of a high voltage pulse to be supplied as input to grid 42 of travelling wave tube 44. ON and OFF trigger pulses are converted to appropriate voltage levels by ground deck driver 15 and coupled through transformers 20 to control pulse drivers 22 and 24. An ON control pulse delivered from driver 22 operates FET ON switch 26 to switch regulated B+ voltage to output terminal 36 to generate a fast rise time output pulse, as shown at 70 in FIG. 1. FET ON switch 26 will remain in an ON condition until receipt of an OFF control pulse from OFF control pulse driver 24.

The OFF control pulse serves to discharge the input capacitance of FET ON switch 26 and inititate the falling edge of a pulse at output terminal 36. However, due to a large load capacitance presented by travelling wave tube 44 and associated circuitry, an OFF control pulse supplied by driver 24 is not capable of generating a falling edge with a sufficiently fast fall time. Accordingly, pulse cut-off circuit 48 is activated through driver 52 to discharge the capacitance present at terminal 36 and generate a steep falling edge. Since switch 48 operates to trim the tail off the falling edge of an output pulse provided by FET ON switch 26, circuit 48 is often referred to as a "tail biter" switch.

As can be seen at 70 in FIG. 1, an output pulse having extremely fast rise and fall times is provided at terminal 36. However, the presence of ringing on pulse 70 can be detected as shown by the presence of a peak 72 present at the end of the rise time of the output pulse shown at 70. As previously described, such ringing is unacceptable in certain applications. The invention thus includes clamp means coupled to the first switch means output terminal for maintaining a constant voltage of the output pulse during the duration of the output pulse. As embodied herein, the clamp means comprises diode 64 and means for maintaining the constant voltage level with respect to a predetermined referenced level, the maintaining means in the preferred embodiment comprising active clamp shunt regulator circuit 68.

Clamp shunt regulator 68 is provided to actively limit the voltage level throughout the duration of the output pulse to a predetermined level. Since the B+ voltage supplied to FET ON switch 26 is regulated by B+ regulator 28, the desired level of output pulse will be closely approximated and maintained. However, active clamp shunt regulator 68 provides an even more precise control of the shape and level of the output control pulse and to prevent ringing. Such a precise control is required for many applications, including pulse control of synthetic aperture radar. Accordingly, the apparatus provides a pulse as shown at 74 having extremely fast rise and fall times and an extremely flat pulse duration. This provides an input pulse to travelling wave tube 44 which in turn provides a high powered pulse especially suited for synthetic aperture radar systems.

Referring now to FIG. 2, there is shown a detailed electrical schematic of the block diagram of FIG. 1 which constitutes a preferred embodiment of the invention. As can be seen in FIG. 2, ground deck driver 15 includes a pair of voltage level converters 102 and 104 which convert ON and OFF triggers signals from a TTL logic level of 0–5 volts to a level of approximately 20 volts. Devices 102 and 104 may constitute type DS0026 interface circuits commercially available from the National Semiconductor Corporation. The outputs of devices 102 and 104 are supplied to single-turn primary windings of coupling transformers T1,T2. Transformers T1,T2, to be described in greater detail, include toroid cores 110,112 and secondary windings 114,116 electrically isolated from cores 110,112 and primary windings 103,105 by quartz glass isolating tubes 118,120. Since primary windings 103,105 are referenced to ground level and secondary windings 114,116 are referenced to 40 KV, extremely high dielectric strength is required to provide effective isolation between primary windings 103,105 and secondary windings 114,116. Quartz glass has a dielectric strength of approximately 15 kilovolts per mil. Therefore, tubes 118,120 having a thickness of 15 mils are provided. Moreover, quartz glass has extremely high mechanical strength and is therefore especially suitable for use in the rugged environments to which the present invention may be subjected. The transport time of pulse signals through transformers T1,T2 is only a few nanoseconds, compared to optical couplers having transport times on the order of 100–200 nanoseconds. The use of transformers T1,T2 having quartz glass isolating tubes 118,120 thereby reduces pulse jitter and permits higher system-to-system reproducibility.

ON and OFF trigger signals at a level of approximately 25 volts are supplied across input resistors 122,124 to the control gates of FET transistors Q1 and Q2 the current paths of which are connected in series with load resistors 126,128, respectively, between floating deck ground and a source 130 of medium potential voltage. In the preferred embodiment, source 130 has a potential of 100 volts. Transistors Q1 and Q2 are 150 volt power MOSFET devices having a pulse rating of 22 amperes. Transistors Q1 and Q2 may be, for example, type UFNF251 FETs commercially available from the Unitrode Corporation. The junction between load resistor 126 and transistor Q1 is connected to one end of the series combination of single turn primary windings of three transformers T3. The other end of the series combination of primary windings of transformers T3 is connected through a capacitor 132 to floating deck ground.

The junction of load resistor 128 and transistor Q2 is connected to one end of the series combination of three single turn primary windings of transformers T4. The other end of the series combination of primary windings of transformers T4 is connected to one end of a single turn primary winding of a transformer T5. The other end of the primary winding of transformer T5 is connected through a capacitor 134 to floating deck ground. Transformers T3 and T4 include nonsaturating toroid cores 145, 147.

Transformer T5 has a single turn secondary winding which is connected to the input circuit of an FET transistor Q3 the current path of which is connected at one end through a resistor 140 to medium potential voltage source 130 and at the other end to floating deck ground. The junction between transistor Q3 and resistor 140 is connected to one end of the series combination of single turn primary windings of three transformers T6, the other end of which is connected through a capacitor 142 to floating deck ground.

FET ON switch 26 includes FETs Q4, Q5, and Q6 the current paths of which are connected in series between the output of B+ regulator 28, at the terminal 143, and an output terminal 36. ON and OFF control pulses supplied by transistors Q1 and Q2 of drivers 22 and 24, respectively, are coupled through transformers T3,T4, respectively, to diode-gated input circuits of FETs Q4, Q5, and Q6.

The input circuits of transistors Q4, Q5, and Q6 are identical and include the secondary windings of transformers T3 and T4. One terminal of the secondary windings of tranformers T3 and T4 are connected to each other. The other terminal of the primary winding of transformer T3 is connected through a diode 146 to the control gate of the respective FET Q4, Q5, or Q6. A diode 148 is connected between the two terminals of the secondary winding of transformer T4. A zener diode 150 is connected between the anode of diode 148 of the respective FET Q4, Q5, or Q6. Three resistors 156 are connected in series to form a voltage divider, one end of which is connected to B+ regulator 28. The junction of each of the secondary winding of transformers T3 and T4 is connected to the voltage divider formed of resistors 156. The parallel combination of 152 and a capacitor 154 is connected between the gate of the respective transistors Q4, Q5, or Q6 and the junction of the secondary windings of T3 and T4.

Tail biter circuit 48 includes three FETs Q7, Q8, and Q9, the current paths of which are connected in series, with one end of the series combination being connected to output terminal 36 of FET ON switch 26 and the other end being connected through capacitor 50 to floating deck ground. A voltage divider is formed by the series combination of three resistors 160, one end of which is connected to the voltage divider formed by resistors 156 and the other end of which is connected through a current limiting resistor 161 to B− terminal 46.

Cutoff control pulses formed by driver 52 are coupled through transformers T6 to identical input circuits of FETs Q7, Q8, and Q9. One terminal of the secondary windings of transformers T6 is coupled to the voltage divider formed by resistors 160. The other end of the secondary windings of transformers T6 is connected through diodes 162 to the control gate of respective FETs Q7, Q8, and Q9. A resistor 164 and a capacitor 166 are connected in parallel between the control gates of respective transistors Q7, Q8, and Q9 and the voltage divider formed by resistors 160. FETs Q4, Q5, Q6, Q7, Q8, and Q9 are 1000 volt power MOSFET devices rated at 8 amps pulse current, such as, for example, type MTMIN100 devices commerically available from the Motorola Corporation.

As shown in FIG. 2, clamp shunt regulator 68 includes an integrated circuit regulator chip 170 which may be, for example, a type UA741 operational amplifier circuit the output of which is connected to the control gate of a switching regulator transistor Q10. The current path of transistor Q10 is connected between a clamp shunt regulator output terminal 172 and floating deck ground 32. A potentiometer 174 has its wiper connected to the noninverting input of circuit 170 and its other terminals connected in series between floating deck ground and one terminal of a resistor 176, the other terminal of which is connected to output terminal 172. Output terminal 172 is connected through an isolating resistor 178 to B+ regulator 28 at terminal 143.

As shown in FIG. 1, clamp shunt regulator 68 includes a load capacitor 66 connected between the output terminal of clamp shunt regulator 68 and floating deck ground. In the preferred embodiment, as shown in FIG. 2, capacitor 66 is separated into a plurality of parallel connected capacitors 180 and 184.

In the preferred embodiment, capacitor 180 has a considerably larger capacitance than that of capacitor 184. Capacitor 184 is physically located near the grid terminal 42 of travelling wave tube 44 to provide the necessary degree of output pulse control and arc protection. However, it is also necessary to minimize the weight of apparatus physically mounted on travelling wave tube 44 to ensure rugged and reliable operation. Accordingly, the present invention provides that output capacitor 66 connected between the output of B+ regulator 28 and floating deck ground included capacitors 180 and 184 which are physically separated. The function of clamp diode 64 of FIG. 1 is, in the preferred embodiment, performed by a pair of series connected diodes 188 and 190.

Figure 3:
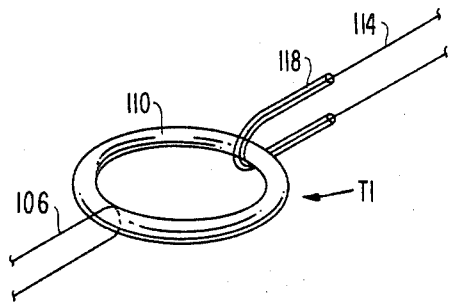
FIG. 3 is a perspective view of a coupling transformer used in the apparatus of FIGS. 1 and 2.

Referring now to FIG. 3, there is shown a detailed view of transformer T1. As can be seen, transformer T1 includes a primary winding 106 and a secondary winding 114. Core 110 is a toroid core of ferrite material such as 3C5 material commercially available from the Ferroxcube Corporation. Primary winding 106 is a single turn winding of conventionally insulated wire, referenced to ground deck ground. Winding 114 is also a single turn winding, but referenced to floating deck ground which, in the preferred embodiment, is 40,000 volts above ground deck ground.

Prior art coupling transformers provided isolation between primary winding 106 and secondary winding 114 by winding high dielectric film insulation such as the material known commercially at Capton. To be effective, the Capton insulation had to be carefully wound around core 110 with a large degree of overlap to present a long creep distance to prevent voltage breakdown. This critical and painstaking procedure created problems when transformer T1 was manufactured in high volumes. In the prior art, transformers T1 were sometimes potted with potting compound having high dielectric strength. However, under severe environmental conditions, over a long period of time, migration would sometimes occur leading to voltage breakdown. Accordingly, the present invention provides a transformer T1 in which isolation between primary winding 106 and secondary winding 114 is provided through the use of a quartz glass insulating tube 118. Tube 118 in the preferred embodiment has a wall thickness of 15 mils, thus providing 225 KV total withstand capability. Tube 118 is heated to form a U-shape and formed around a core 110. Winding 114 is then threaded through tube 118. A transformer constructed as shown in FIG. 3 exhibits extremely low transport delay, reduced pulse jitter, increases system-to-system reproducibility, and exhibits a high degree of reliability due to the characteristics of quartz glass which include high stability and great mechanical strength.

The operation of the preferred embodiment shown in FIG. 2 is as follows. An ON trigger pulse at a TTL level is coupled to the input of circuit 102 where it is raised to a 20 volt level and coupled through transformer T1 to the input of FET Q1. Q1 provides an ON control pulse which is coupled through transformers T3 to render FETs Q4, Q5, and Q6 conducting and initiate an output pulse on output terminal 36. The transistors Q4, Q5, and Q6 remain conducting, even after the expiration of the ON control pulse due to the inherent input capacitance of FETs Q4, Q5, and Q6.

An OFF trigger pulse at a TTL level is then coupled to circuit 104 where it is converted to a 20 volt level and coupled through transformer T2 to FET Q2. FET Q2 fires, producing an OFF control pulse through transformers T4 to discharge the input capacitance of FETs Q4–Q6 and render them nonconducting. The deleterious effects of Miller integration which cause degradation of pulse rise and fall times are prevented by the action of capacitors 154 which serve to increase the FET gate-to-source capacitance and change the voltage divider formed by the drain-to-gate capacitance and the gate-to-source capacitance. Capacitors 154 should have a value of about 1000 picofarad such that the transient feedback from the positive-going drain during turnoff cannot generate enough voltage on the FET gate to turn the FET back on. The same operation occurs when tail biter circuit 48 is pulsed.

Although the off control pulse serves to end the duration of the output pulse produced on output terminal 36, the capacitive loading of travelling wave tube 44 and associated circuitry would render a rather gradual falling edge for the output pulse. Accordingly, tail biter circuit 48 is also triggered by the OFF control pulse formed by FET Q2. That is, the OFF control pulse is coupled through transformer T5 to FET Q3 to produce a cutoff pulse through transformers T6 to render FETs Q7–Q9 conductive and forceably drive the potential at output terminal 36 toward B— level. This produces an extremely steep-sided falling edge, thereby producing an output pulse having fast rise and fall times, as shown at 70. However, a certain amount of ringing is present on the pedestal of the output pulse, as shown at 72 in FIG. 1. Accordingly, diode clamp 64 consisting of series connected diodes 188 is provided. In addition, the reference level for clamping diode 64 is established and maintained by clamp shunt regulator 68. By suitable adjustment of potentiometer 174, the proper reference level can be established to ensure an extremely flat pedestal for the output pulse present at output terminal 36 as shown at 74 in FIG. 1. Moreover, due to the feedback provided from terminal 172 through potentiometer 174, the selected clamping reference level is accurately maintained over all operating conditions of the apparatus 10.

Figure 4:
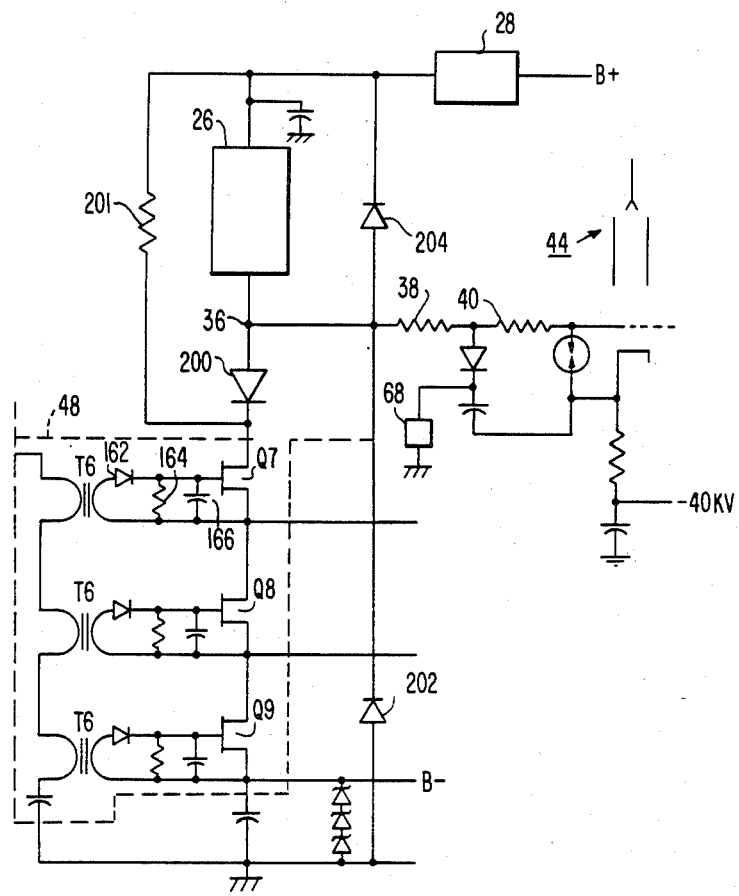
FIG. 4 is a detailed electrical schematic diagram of a pulse cutoff circuit constituting an alternative embodiment of the present invention.

An alternative embodiment of a portion of apparatus 10 is shown in FIG. 4. A diode 200 is connected in series between FET ON switch output terminal 36 and the current path of FETs Q7, Q8 and Q9 and a charging resistor 201 is added to precharge the drain to gate capacitances of Q7–Q9. Diode 200 and resistor 201 prevent Miller integration feedback of transistors Q7–Q9 during the pulse turn-on period. However, addition of diode 200 may serve to render FET ON switch 26 and tail biter circuit 48 more susceptible to damage due to arcing at travelling wave tube 44. Accordingly, a diode 202 is connected between floating deck ground and output terminal 36 with a polarity opposite to that of diode 200 to shunt negative transients. Additionally, a diode 204 is connected between the output of B+ regulator 28 and output terminal 36 to shunt positive transients. The combination of diodes 200, 202, and 204 provide improved performance of tail biter circuit 48 while maintaining the necessary degree of protection against damage caused by arcing at travelling wave tube 44.

It will be apparent to those skilled in the art that various modifications and variations can be made in the high voltage pulse apparatus of the present invention and in the construction of the FET ON switch 26 and tail biter circuit 48 without departing from the scope or spirit of the invention. As an example, there can be more or fewer than three FETs in the FET ON switch 26 and tail biter circuit 48. Thus, it is intended that the present invention cover the modifications and variations of this invention provided they come within the scope of the appended claims and their equivalents.

What is claimed is:

1. A high voltage pulse apparatus, comprising:
   means referenced to a low potential reference level for receiving control pulses;
   first switch means referenced to a high potential reference level, said first switch means having an output terminal and being responsive to said control pulses for generating a fast rise time output pulse at said output terminal;
   second switch means referenced to said high potential referenced level and coupled to said first switch means for terminating said output pulse;
   means for coupling said control pulse receiving means to said first and second switch means; and
   clamp means coupled to said output terminal for maintaining a constant voltage of said output pulse during the duration of said output pulse wherein said clamp means comprises means for maintaining said constant voltage with respect to a predetermined reference level.

2. An apparatus as recited in claim 1 wherein said means for maintaining said constant voltage with respect to a predetermined reference level comprises an active shunt regulator.

3. An apparatus as recited in claim 2 wherein said active shunt regulator comprises an output terminal, an output capacitor connected between said regulator output terminal and said high potential reference level, a resistor connected in parallel with said output capacitor, and a plurality of series-connected diodes connected between said first switch means output terminal and said regulator output terminal.

4. An apparatus as recited in claim 3 wherein said output capacitor comprises first and second capacitors, said first and second output capacitors being physically separated.

5. A high voltage pulse apparatus, comprising:
   means referenced to a low potential reference level for receiving control pulses;
   first switch means referenced to a high potential reference level, said first switch means having an output terminal and being responsive to said control pulses for generating a fast rise time output pulse at said output terminal;
   second switch means referenced to said high potential reference level and coupled to said first switch means for terminating said output pulse;
   means for coupling said control pulse receiving means to said first and second switch means wherein said coupling means comprises a transformer including a primary winding referenced to said low potential reference level, a secondary winding referenced to said high potential reference level, and insulation means formed of quartz glass for electrically isolating said primary and secondary windings.

6. An apparatus as recited in claim 5 wherein said transformer further including a toroid core and said primary and secondary windings each comprise a single-turn winding.

7. An apparatus as recited in claim 1 further comprising a first voltage supply of a first polarity referenced to said high potential reference level and a second voltage supply of a second polarity referenced to said high potential reference level, and wherein said first switch means comprises a first plurality of FETs connected in series between said first voltage supply and said first switch means output terminal, and wherein said second switch means comprises a second plurality of FETs connected between said first switch means output terminal and said second voltage supply, each of said first and second plurality of FETs having a gate terminal and a pair of output terminals.

8. An apparatus as recited in claim 7 further comprising a diode connected between said first and second pluralities of FETs, a second diode connected between said first switch means output terminal and said first voltage supply, and a third diode connected between said first switch means output terminal and said second voltage supply.

9. An apparatus as recited in claim 7 further comprising a plurality of capacitors each connected between said gate terminal and one of said output terminals of an associated one of said first plurality of FETs.

10. An apparatus as recited in claim 7 further comprising a plurality of first and second FET coupling transformers, one of said first and second FET coupling transformers being associated with each of said first plurality of FETs, each of said FET coupling transformers having a single-turn secondary winding with two terminals, one of said terminals of said secondary windings of associated ones of said first and second FET coupling transformers being connected at a junction, each of said junctions being connected to an associated capacitor-connected FET output terminal, said apparatus comprising a plurality of resistors each connected in parallel with one of said capacitors, a plurality of Zener diodes each connected between the other of said output terminal of associated first and second FET coupling transformers, and a plurality of diodes each connected between one of said junctions and one of said FET coupling transformer output terminals.

* * * * *